(12) United States Patent
Bosy et al.

(10) Patent No.: US 7,598,725 B2
(45) Date of Patent: Oct. 6, 2009

(54) ALIGNMENT RECEPTACLE OF A SENSOR ADAPTED TO INTERACT WITH A PIN TO GENERATE POSITION DATA ALONG AT LEAST TWO TRANSVERSE AXES FOR DOCKING A TEST HEAD

(75) Inventors: Brian J. Bosy, Framingham, MA (US); Craig A. DiPalo, Acton, MA (US); Seth E. Mann, Reading, MA (US); David W. Lewinnek, Somerville, MA (US); Michael A. Chiu, Somerville, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/323,557

(22) Filed: Dec. 30, 2005

(65) Prior Publication Data

US 2007/0152695 A1  Jul. 5, 2007

(51) Int. Cl.
*G01R 31/02* (2006.01)
(52) U.S. Cl. .................................. 324/158.1; 324/758
(58) Field of Classification Search ................ None
See application file for complete search history.

(56) References Cited

U.S. PATENT DOCUMENTS

| | | | |
|---|---|---|---|
| 5,172,053 A | 12/1992 | Itoyama | |
| 5,321,453 A | 6/1994 | Mori et al. | |
| 5,600,258 A * | 2/1997 | Graham et al. | 324/758 |
| 5,861,759 A | 1/1999 | Bialobrodski et al. | |
| 5,900,737 A * | 5/1999 | Graham et al. | 324/758 |
| 6,057,695 A | 5/2000 | Holt et al. | |
| 6,111,419 A * | 8/2000 | Lefever et al. | 324/754 |
| 6,166,552 A * | 12/2000 | O'Connell | 324/754 |
| 6,448,797 B1 * | 9/2002 | Holt et al. | 324/758 |
| 2003/0201764 A1 | 10/2003 | Jafari et al. | |
| 2004/0140794 A1 | 7/2004 | Back | |

FOREIGN PATENT DOCUMENTS

| | | |
|---|---|---|
| WO | WO 02/25292 | 3/2002 |
| WO | WO 03/008984 | 1/2003 |

OTHER PUBLICATIONS

Six Degree of Freedom Sensing for Docking Using IR LED Emitters and Receivers; Kimon Roufas, Ying Zhang, Dave Duff, Mark Yim; D. Rus and S. Singh (Eds.): Experimental Robotics VII, LNCIS 271, pp. 91-100, Springer-Verlag Berlin Heidelberg 2001.
PCT International Search Report and Written Opinion of International Searching Authority dated Jun. 13, 2007, 2 pages.

* cited by examiner

*Primary Examiner*—Paresh Patel
(74) *Attorney, Agent, or Firm*—Foley & Lardner LLP; Joseph M. Maraia; Ralph Trementozzi

(57) ABSTRACT

An apparatus and method are provided for the automatic operation of a manipulator to move a test head or peripheral into position for proper alignment and docking of the test head with the peripheral. Examples of peripherals include a handler and a prober. Sensors are provided to obtain relative positional information of the test head in the relation to the peripheral, allowing a controller to issue instructions to the manipulator to correct differences in each of the six degrees of freedom between the mating surfaces of the test head and the manipulator.

10 Claims, 9 Drawing Sheets

ALIGNMENT RECEPTACLE OF A SENSOR ADAPTED TO INTERACT WITH A PIN TO GENERATE POSITION DATA ALONG AT LEAST TWO TRANSVERSE AXES FOR DOCKING A TEST HEAD

BACKGROUND

Test equipment, particularly automatic test equipment (ATE) used in testing electronic equipment, often involves large, heavy equipment. In one example, a test head contains a substantial amount of electronics for use in testing integrated circuits (ICs). Such a test head may weigh 500 to 3,000 pounds. The test head is supported by a manipulator, which is used to position the test head proximate to a peripheral, such as a handler or prober, depending on the type of equipment to be tested. Operators typically interact with the manipulator, thereby moving the test head next to the peripheral to align the faces of the test head and peripheral in preparation for docking the test head to the peripheral.

The operator's interaction with the manipulator has typically required manually positioning the test head or turning hand wheels to adjust horizontal position and twist, roll and yaw angles. In some applications, a motor in the manipulator is manually activated to raise or lower the test head. Also, direct pushing or lifting of the test head by operators is sometimes required to move the test head and peripheral close enough for the final pull down phase of docking, involving alignment and clamping. A substantial risk of damage to the test head and/or peripheral exists because movement of the heavy test head relative to the peripheral is controlled by the operator. Collisions of any form between the test head and peripheral can easily damage the delicate components on both sides or injure the operator. Precise alignment is required, as many small components are often being coupled in the docking process, including some having at least several hundred electrical connectors per square inch. Also, due to the physical size and weights of test heads and the six degrees of freedom of the test head movement required to be managed, movement of the test head to enable the docking process can be a very time consuming and iterative process, involving substantial hand cranking of controls, or pushing of the test head, by the operator to obtain the proper test head position.

SUMMARY

The present invention is directed toward addressing a need in the art to improve the process of moving the test head relative to the peripheral. Various embodiments of the present invention represent a fundamental shift of how test heads are currently docked. Various embodiments of the present invention can sense positional error and provide automated movement of the test head and/or peripheral to locate the test head relative to the peripheral for docking. Other embodiments of the invention can provide instructions to an operator interface to instruct an operator on the movements required, allowing the operator to follow the instructions to move the test head relative to the peripheral.

According to an illustrated embodiment of the invention, a method for docking a test head is provided. The method includes receiving positional information regarding the position of a peripheral relative to a test head. The test head and/or the peripheral are supported by a manipulator. The test head and/or peripheral are automatically moved relative to each other, by instructing a manipulator to move the test head relative to the peripheral, to enable docking of the test head to the peripheral.

According to another illustrated embodiment of the invention, a testing device is provided including a test head and a manipulator coupled to a support structure. At least one sensor is provided for determining a position of the test head relative to a peripheral. A controller is configured to determine an instruction for the manipulator to change the position of the test head relative to the peripheral to enable docking of the test head to the peripheral.

According to a further illustrative embodiment of the invention, a testing device is provided having means for supporting and moving a test head relative to a peripheral. Means for detecting a relative position between the test head and peripheral are also provided along with means for determining instructions for automatically moving the test head relative to the peripheral to enable the docking of the test head to the peripheral, the means for supporting and moving being responsive to the means for determining instructions.

BRIEF DESCRIPTION OF THE DRAWINGS

The invention will be apparent from the description herein and the accompanying drawings, in which like reference characters refer to the same parts throughout the different views.

DETAILED DESCRIPTION

Various embodiments of the present invention address the process of moving the test head relative to the peripheral. The traditional manipulator was developed when it was easy to simply guide the small test head over to the peripheral by hand and dock it to the peripheral. This is no longer valid for large, heavy test heads, many of which involve air cooling hoses and other cable connections, often requiring jolts or "hip" checks to get the interface to completely dock. In traditional compliant docking, the manipulator/test head system is required to move freely or free float during the final mechanical latching of the interface to the peripheral. Usually the compliant range of motion is 0.5 inch and the forces generated during docking are attempted to be limited to 50 pounds or less.

Embodiments of the present invention can provide a positional controlled manipulator, such that the test head's mating surface is accurately positioned relative to the peripheral, seeking to minimize a need for any mechanical float to accomplish docking. By use of some embodiments of the present invention, with positional information and the ability to accurately move the test head in six degrees of freedom, a test head and/or peripheral could be driven to the required final docked position without need for compliance.

For a positional based manipulator with a large test head mass, higher system stiffness may be preferred to reduce oscillations and overcome external forces. However, since docking forces are a product of stiffness and positional error, greater positional accuracy is required in the case of a test head. For example, system stiffness in the order of 1000 pounds per inch, docking errors of less than a 0.039" (one millimeter) may be required, if docking forces less than 50 pounds are to be achieved.

Some embodiments of the invention can provide benefits, such as mitigating external force problems encountered with traditional systems. Examples of such forces include forces from cables, hoses, and mass imbalances caused by the center of gravity of the test head not being co-located with the axes of rotation of the manipulator. The controller, and optionally the operator, may have control over the position of the test head at all times if the embodiment of the invention does not provide for free floating of the test head. Also, the need for a means of constraining gross motion, or clamping, between the test head and peripheral, such as outer pull down modules, as is common in traditional systems, may not be required in various embodiments of the invention. Furthermore, soft docking, e.g. manually moving the test head to a relative position with respect to the peripheral using visual feedback, without providing any constraints, may be used with some embodiments of the invention.

Figure 1:
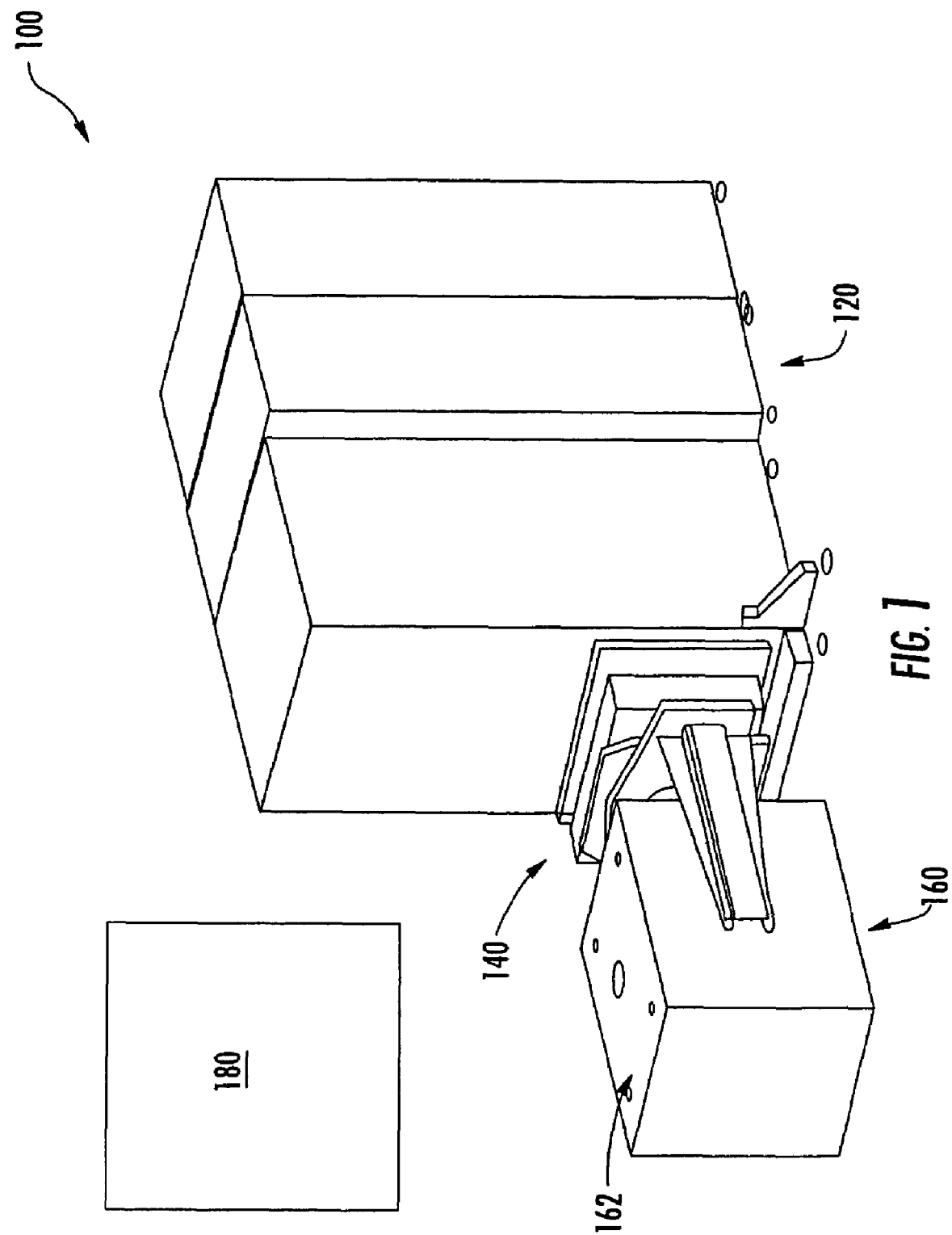
FIG. 1 is a perspective view of a testing device according to an illustrative embodiment of the present invention.

With reference to FIG. 1, a testing device 100 is illustrated according to an example embodiment of the invention. The testing device 100 includes a support cabinet 120. The manipulator 140 is coupled to the support cabinet 120. The manipulator 140 controls the location of the test head 160. The test head 160 is moved by the manipulator 140 such that the mating surface 162 of the test head 160 is aligned with the mating surface of a peripheral 180, such that the test head 160 can be docked with the peripheral 180. In another example of the invention involves a manipulator 140 free standing and/or detachable from a support cabinet 120. It is further understood that, in alternative implementations, the manipulator can control the position of the peripheral 180. In other alternative implementations, the manipulator can control the position of both the test head 160 and peripheral 180.

Figure 2:
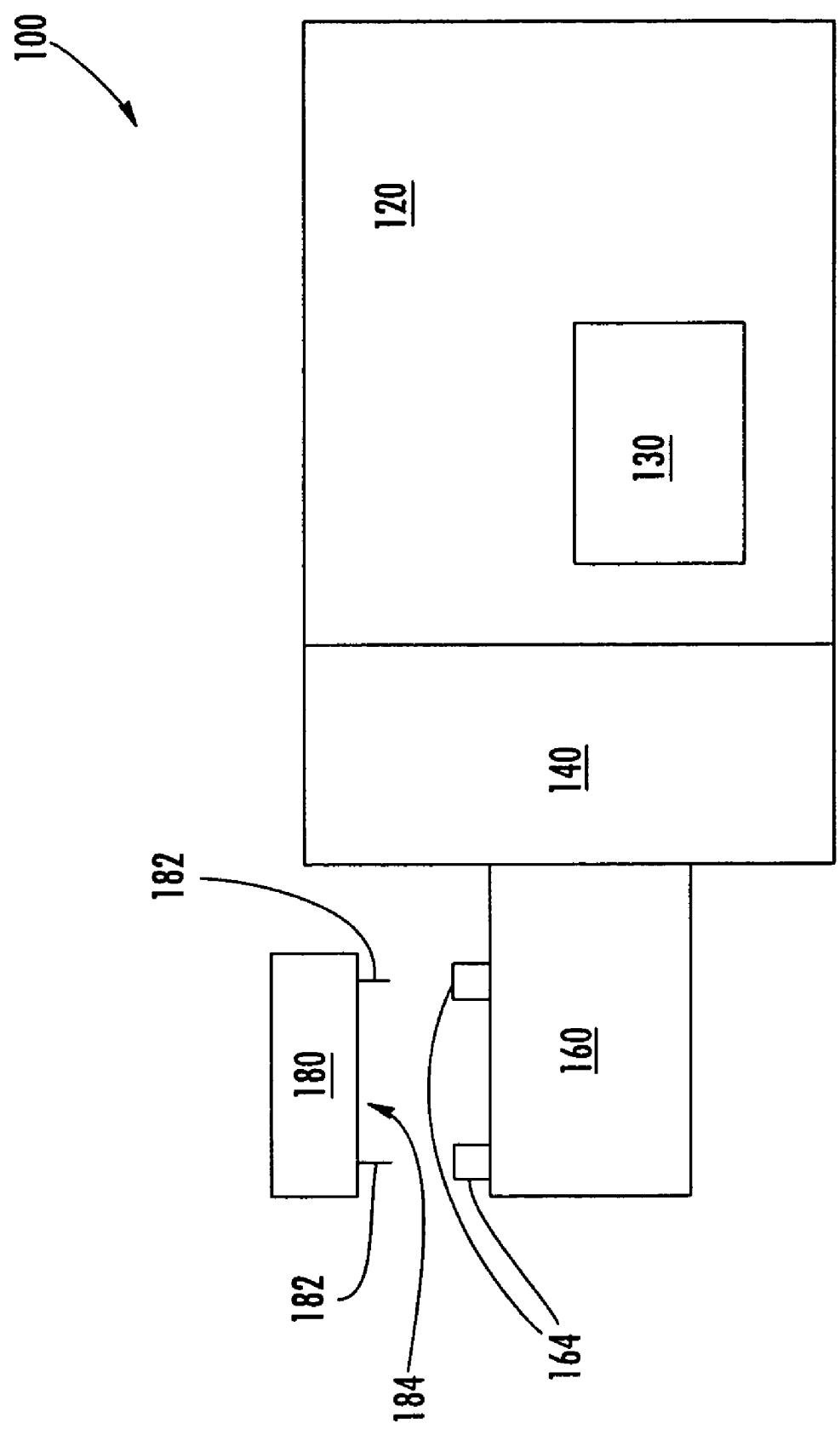
FIG. 2 is a schematic view of the testing device of FIG. 1.

A schematic illustration of the testing device 100 is illustrated in FIG. 2. The testing device 100 includes a controller 130 that may be located within the support cabinet 120. The controller 130 can be used to control the manipulator 140 and, optionally, also the testing process of a device under test, as carried out through the test head 160 and peripheral 180. The test head 160 is provided with at least one sensor 164 that is configured to determine the position of the test head 160 relative to the peripheral 180. In the illustrative embodiment, the test head 160 is provided with three sensors 164, each of which are capable of obtaining x, y and z axis position location when in contact with a corresponding pin 182 of the peripheral 180.

It may be preferred to keep all the electronics on the test head side to minimize the complexity of the peripheral. In one implementation, a vision system is provided with a single, or multiple sensors, such as digital video cameras, on the test head that are pointed at a known feature, on the mating peripheral. When the test head is sufficiently close to the peripheral, the camera system is used to measure the positioning error. A single camera can be used, or multiple cameras can be added to improve measurement accuracy. While it may be beneficial to have the sensors on the test head to keep the electronics on the test head side, it is understood that the location of one or more of the sensors and pins may be reversed, with the sensors located on the mating surface 184 of the peripheral and pins located on the test head.

Figure 3:
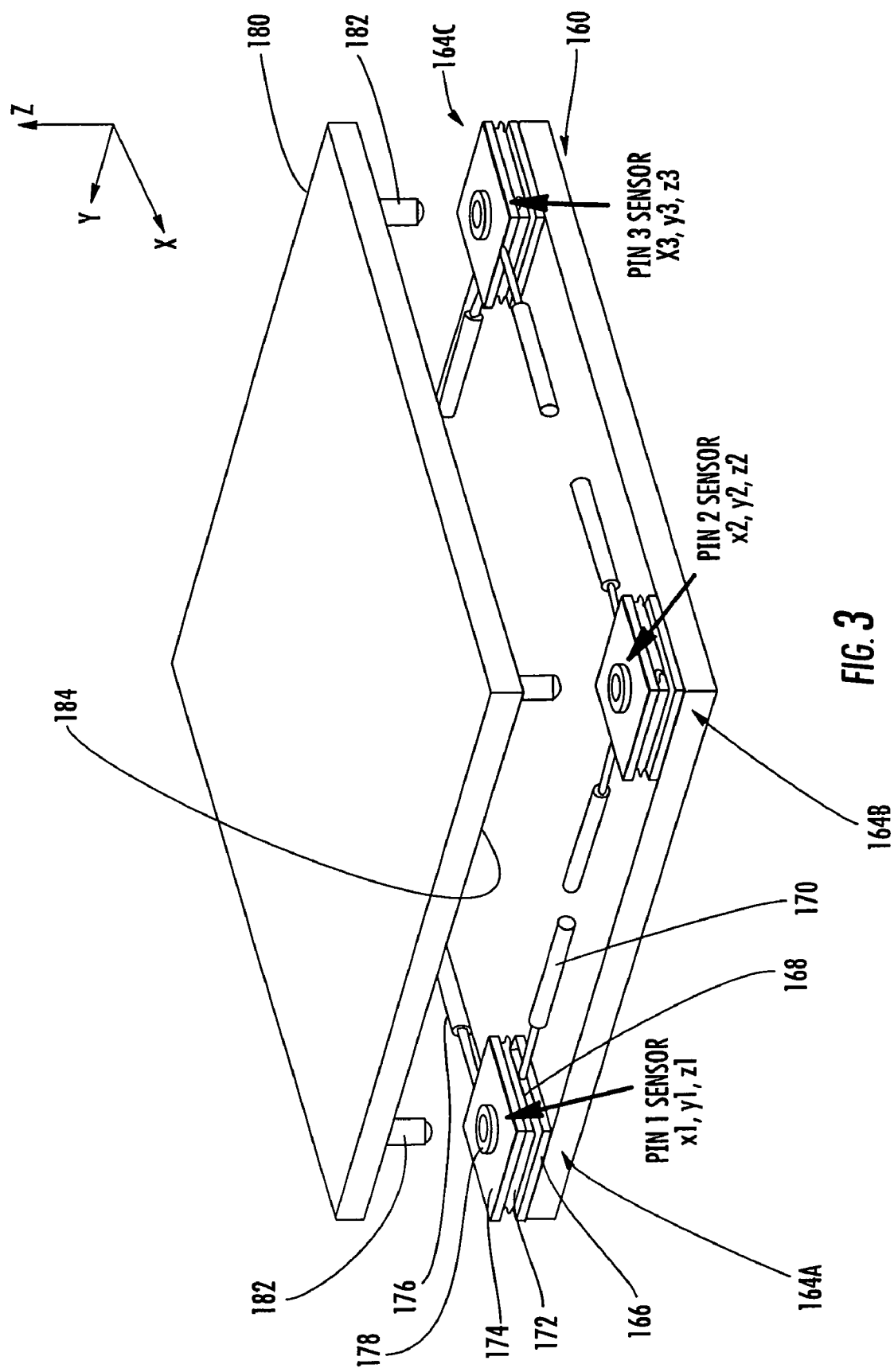
FIG. 3 is a perspective view of another illustrative embodiment of the present invention.

The interaction of the sensor 164 and pin 182 is explained in greater detail with reference to an illustrative embodiment of FIG. 3. For purposes of illustration, the mating surface 184 of the peripheral 180 and the mating surface 162 of the test head 160 are illustrated as separated from and generally already aligned with each other. The test head 160 is provided with three sensors, 164A, 164B, 164C, which are similar to each other.

Figure 4:
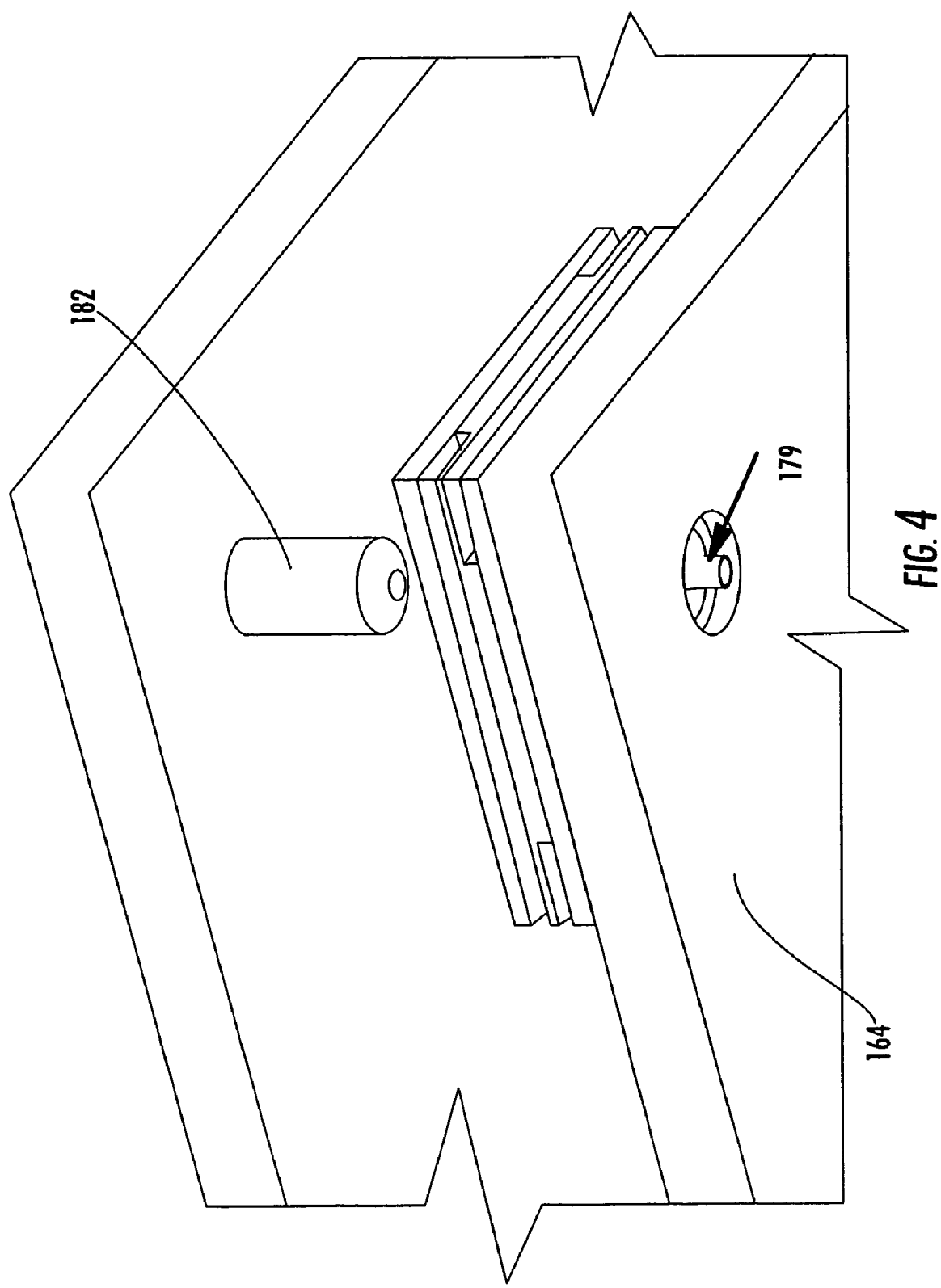
FIG. 4 is another perspective view of a portion of the embodiment of FIG. 3.

Each of the sensors 164A, 164B, 164C in the illustrative embodiment is provided with a base plate 166 that is securely and fixedly mounted to the test head 160. A y axis slider plate 168 is slideably mounted to the base plate 166 along an axis parallel to the y axis. A y axis linear sensor 170 is securely mounted on one end to the y axis slider plate 168 and securely mounted on an opposite end to the test head 160, so as to measure the relative movement of the y axis slider plate 168 along the y axis. An x axis slider plate 172 is slideably mounted to the y axis slider plate 168. The x axis slider plate 172 is slideable along an axis parallel to the x axis relative to the base plate 166. An x axis linear sensor 176 is securely mounted on one end to the x axis slider plate 172 and securely mounted on an opposite end to the test head 160, so as to measure the relative movement along an x axis of the x axis slider plate 172 and the test head 160. A top plate 174 may be provided on a top surface of the sensor 164A, 164B, 164C. A receptacle 178 is provided on the sensor 164A, 164B, 164C to receive the pin 182 of the peripheral 180. The sensor 164A, 164B, 164C also contains a z axis sensor 179, illustrated by way of example in FIG. 4. The z axis sensor 179 detects the position of the pin 182 with respect to the sensor 164A, 164B, 164C and therefore also the test head 160. It is understood that a wide variety of the positional indicators may be used and that the invention is not limited to the slider plate/linear sensor configuration described in connection with the illustrative embodiment.

Throughout the description and figures, in illustrative embodiments where multiple pins 182 are present, the pins will be labeled for convenience and clarity with indices, e.g. 1, 2, 3. The x, y, and z axis information generated by a given sensor 164 will be referred to as xi, yi, and zi, where i=1, 2, 3 is the index of the corresponding pin which comes in contact with the sensor.

With x, y and z axis information obtained from each of the three sensors 164A, 164B, 164C, the six degrees of freedom of the peripheral 180 relative to the test head 160 can be determined when the pins 182 are in contact with the sensors 164.

While the positional sensors are illustrated as mounted on free moving slides and are used to provide distance information, slide locks could be added to the sensors. By being able to lock the position sensor in x, y, and z, the test head could be locked at whatever position is desired. This capability could be beneficial when soft docking or for changing the number of units simultaneously tested by the testing device 100, such as, for example, changing between single and multi-site testing. The capability could also be beneficial when adjusting for different z spacing between the test head and peripheral, such as may occur when changing between single and multi-site testing.

Optionally, a predetermined relative spacing may be programmed to move the test head relative to the peripheral, while maintaining spacing between the test head and peripheral to enable maintenance or reconfiguration of the test head or peripheral. Also optionally, multiple relative positioning settings may be predetermined to enable docking of different configurations, such as single or multi-site configurations. In such a case, the single or multi-site configuration can be designated or detected, providing for automated docking of different configurations having different dimensional docking requirements.

Figure 5:
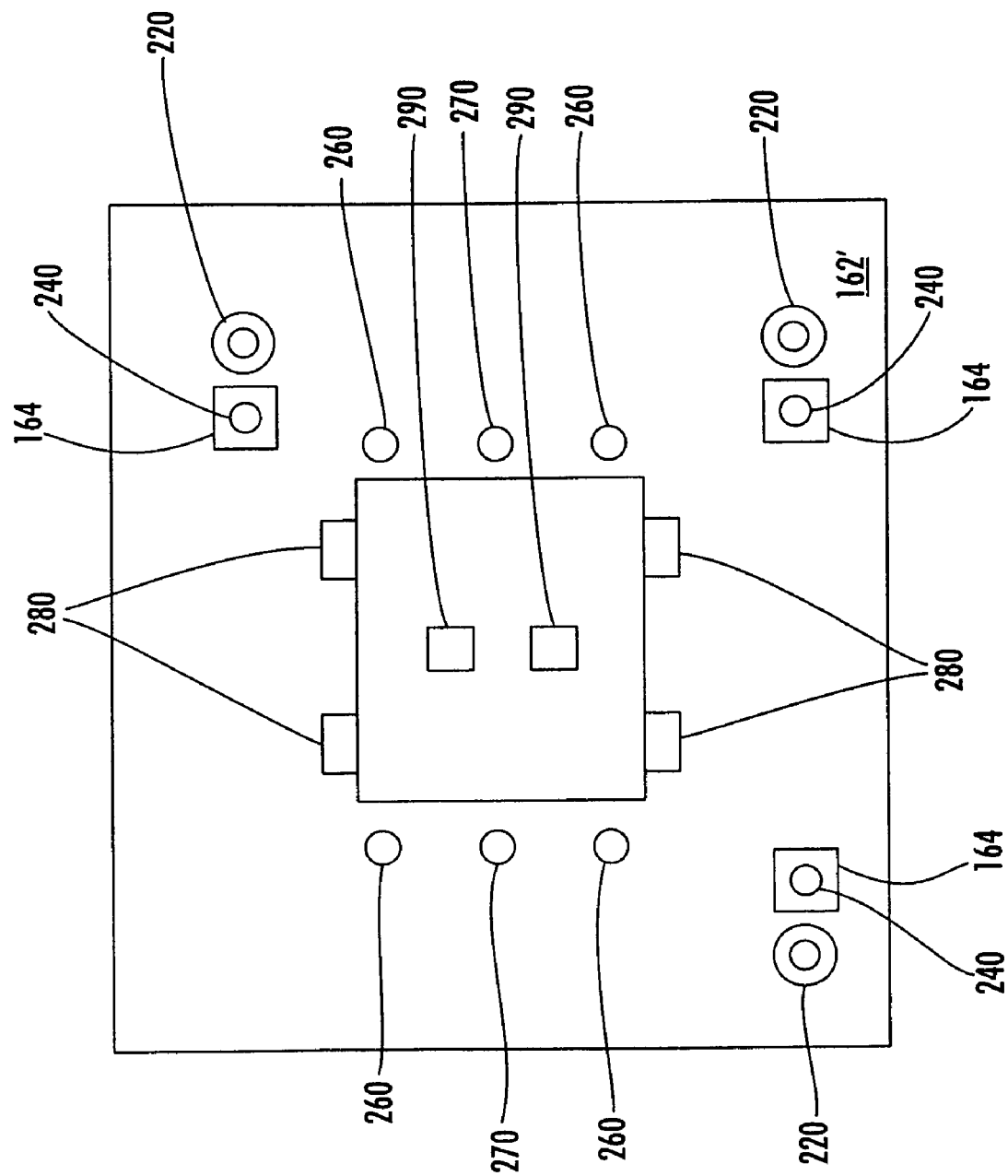
FIG. 5 is a schematic view of a test head mating surface according to another illustrative embodiment of the invention.

With reference to FIG. 5, a further illustrative embodiment of a mating surface 162' is depicted. According to this embodiment, the mating surface 162' is provided with three outer pull-down modules 220 that are capable of drawing the peripheral 180 together with the test head 160 when the peripheral 180 is proximate to the test head 160. Course alignment bushings 240 are also provided. In this embodiment, the course alignment bushings 240 are equipped with sensors 164 capable of providing x, y and z axis location of the peripheral 180 relative to the test head 160. In order to help locate the peripheral 180 relative to the test head 160, course alignment pins 260 may be provided with corresponding receptacles on the peripheral 180, allowing the peripheral 180 to slide down along the course alignment pins 260. Additional fine alignment pins 270 may also be provided to provide very close tolerance location of the peripheral 180 during docking to the test head 160. Cams 280 may be used in the inner pull-down device interface board ("DIB") clamping process to perform the final docking step of the peripheral 180 to the test head 160. According to the illustrative embodiment, two sockets 290 are provided for interfacing with the peripheral. It is understood that the invention may be used with a wide variety of interface boards. Further examples include load boards, handler interface boards and prober interface boards.

Figure 6:
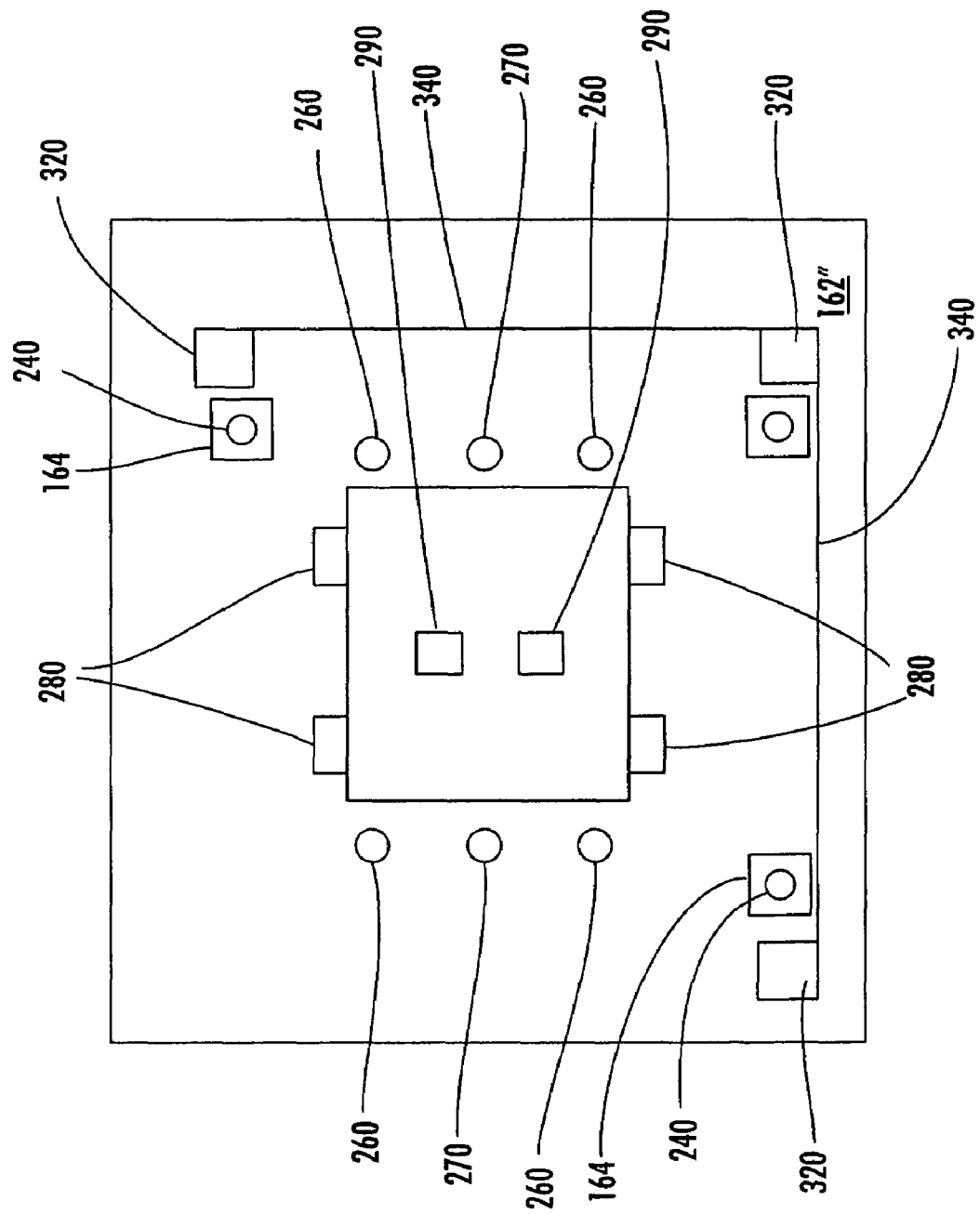
FIG. 6 is a schematic view of a test head mating surface according to another illustrative embodiment of the invention.

In a further illustrative embodiment of the invention, a mating surface 162" is illustrated in FIG. 6. According to this embodiment, cams 320 are provided to perform an outer pull-down process, similar to that performed by the outer pull-down modules 220 of the illustrative embodiment of FIG. 5. The cams 320 are activated by the use of a cable 340 coupled to the cams. The cams 320 interact with a protrusion on the peripheral 180, allowing the cam 320 to pull the peripheral 180 closer to the test head 160.

In an example implementation of the invention, a pendant, optionally including push buttons, a joy stick or other control, can be designed that allows operators to drive the manipulator in x, y, z, twist, tumble, and theta when the test head is away from the peripheral, such as a handler or prober. Operators may drive the manipulator into coarse alignment with the peripheral until two of the three alignment pins are engaged in the bushings on the test head. At this point, the controller may lock out further operator commanded manipulator motions. To continue docking, the operator could, for example, hold down a dock button and the controller may drive the test head into alignment with the peripheral based on feedback from linear sensors 170, 172, 179 (e.g. linear transducers) in each of sensors 164 that are tracking the 3 coarse alignment pins. The manipulator and controller continue to drive the test head to the final docked position. It is understood that the invention is not limited to a pendant and that any type of interface can be used.

When operators wish to undock, they can hold the undock button and wait for the controller to undock the inner pull down mechanism and drive the manipulator away from the peripheral until all three alignment pins are no longer considered engaged in the bushings. At this point, operators can drive the manipulator in all directions as they wish. Optionally, the operator may be required to hold down the dock or undock button along with a standard enable switch while the manipulator is positioning the test head for docking.

Various other optional aspects can be employed in the illustrative embodiments of the invention. For example, limit switches may be provided for one or more axes. The controller may be able to output an analog speed control, digital brake release, digital enable commands, a digital directional command, and LED output for the pendant for each manipulator degree of freedom or axis. The speed control can be used to set the speed of each motor used in the manipulator. Each motor can have a brake and enable command to prevent a single point failure of the controller's output from driving the motor.

The controller may initiate docking whenever an alignment pin is sensed by the controller. The controller may optionally limit manipulator motion to slow speed when the first alignment pin is engaged. After a second pin and at least one other coarse or fine alignment pin are engaged, the controller may optionally stop motion and ignore further commands received from the operator other than 'Dock' or 'Undock'.

When the operator requests docking, in one example, the controller may correct tumble if pins 1 and 2 are engaged or twist if pins 2 and 3 are engaged. Tumble or twist may be aligned by driving the motor until z1 and z2 are equal for tumble or z2 and z3 are equal for twist. All motion in this mode and the remaining docking sequence may be performed by varying the speed of each motor based on the existing error. The error is calculated by subtracting the target position from the current position.

While correcting the tumble or twist misalignment, the controller may check to ensure that the pin detection slides are not nearing the end of travel. If the end of travel is reached, the system may stop and adjust linear misalignment before continuing to correct angular misalignment.

After tumble or twist is corrected, the controller may use x1 and x2 or y2 and y3 to correct theta misalignment. Theta can be calculated from x and y data. Theta alignment may be corrected by driving the motor until x1 and x2 are equal or y2 and y3 are equal depending on whether pin 1 or 3 was engaged first. After theta is aligned, the controller may drive the test head towards the peripheral until the z2 sensor is corrected. At this time, tumble or twist, whichever direction was not corrected originally, may be corrected. This alignment is done again by zeroing out the difference between the z sensors. It is understood that any of the pins and corresponding sensor may be considered 1, 2 or 3 for the purposes of this discussion.

The controller may iterate if any of the angular orientations have moved out of alignment due to motion of the other orientations. When satisfied with the angular alignment, the controller may use the input from y2 to correct y misalignment and the input from x2 to correct x or z misalignment depending upon the orientation of the test head.

The controller may now drive the test head towards the peripheral until the DIB present sensors are tripped or in the case of a DIB on test head, dock until the final calibrated dock position. If at any point, the angular or linear alignment is detected to be outside of the acceptable window, the controller may stop and adjust before continuing towards the peripheral. For a DIB on peripheral dock, when the DIB present sensors are detected, the inner pull down mechanism may be activated and the manipulator may continue to drive towards the peripheral into the final dock position as the inner pull down mechanism drives to the locked position.

By using the existing coarse alignment pins as reference points, it is possible to position two separate pieces of equipment accurately to each other. A three dimensional contact type sensor can be used that would provide dimensional accuracy to within a millimeter, 0.001 inch or better. Various embodiments of the invention may also use other types of positional information systems, including non-contact sensors. Examples of other types of systems can include, but are not limited to, radio frequency (RF) systems, infra-red (IR) light systems, digital imaging systems and/or machine vision systems.

By the use of non-contact sensors that can provide positional information over the entire range of manipulator motion, it may be possible to offer automatic positioning from large test head/peripheral separation distances to docking. Motion playback could also be provided to the operator by recording the instructions and timeline of the instructions provided to the manipulator.

Figure 7:
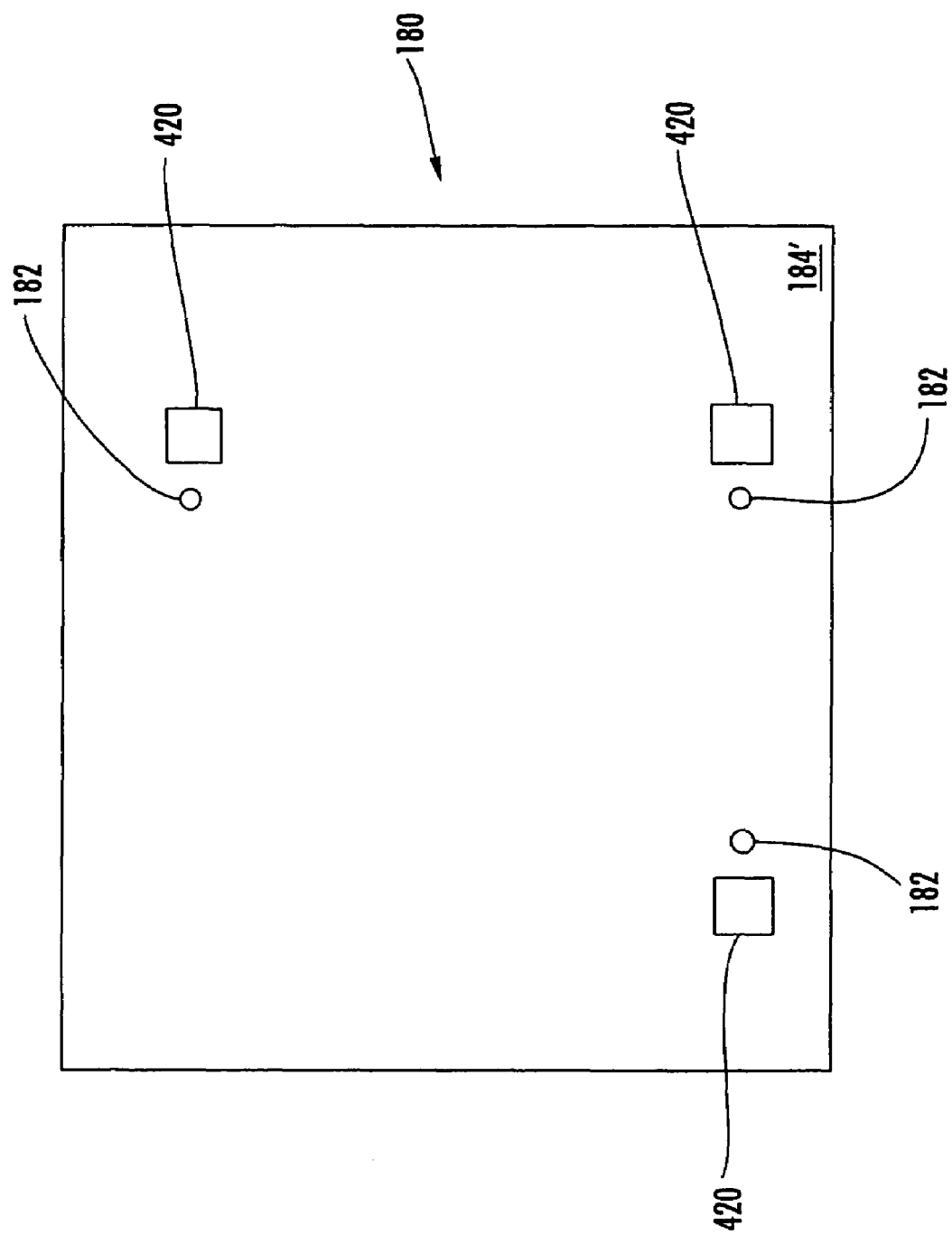
FIG. 7 is a schematic view of a peripheral mating surface according to another illustrative embodiment of the invention.

According to a further illustrative embodiment of the invention shown in FIG. 7, machine vision patterns 420 may be provided on the mating surface 184' of the peripheral 180. According to this embodiment, one or more pins 182 and sensors may still be used in conjunction with the machine vision pattern 420 so as to provide z axis information, if z axis information is not available from the use of the machine vision pattern 420.

Figure 8:
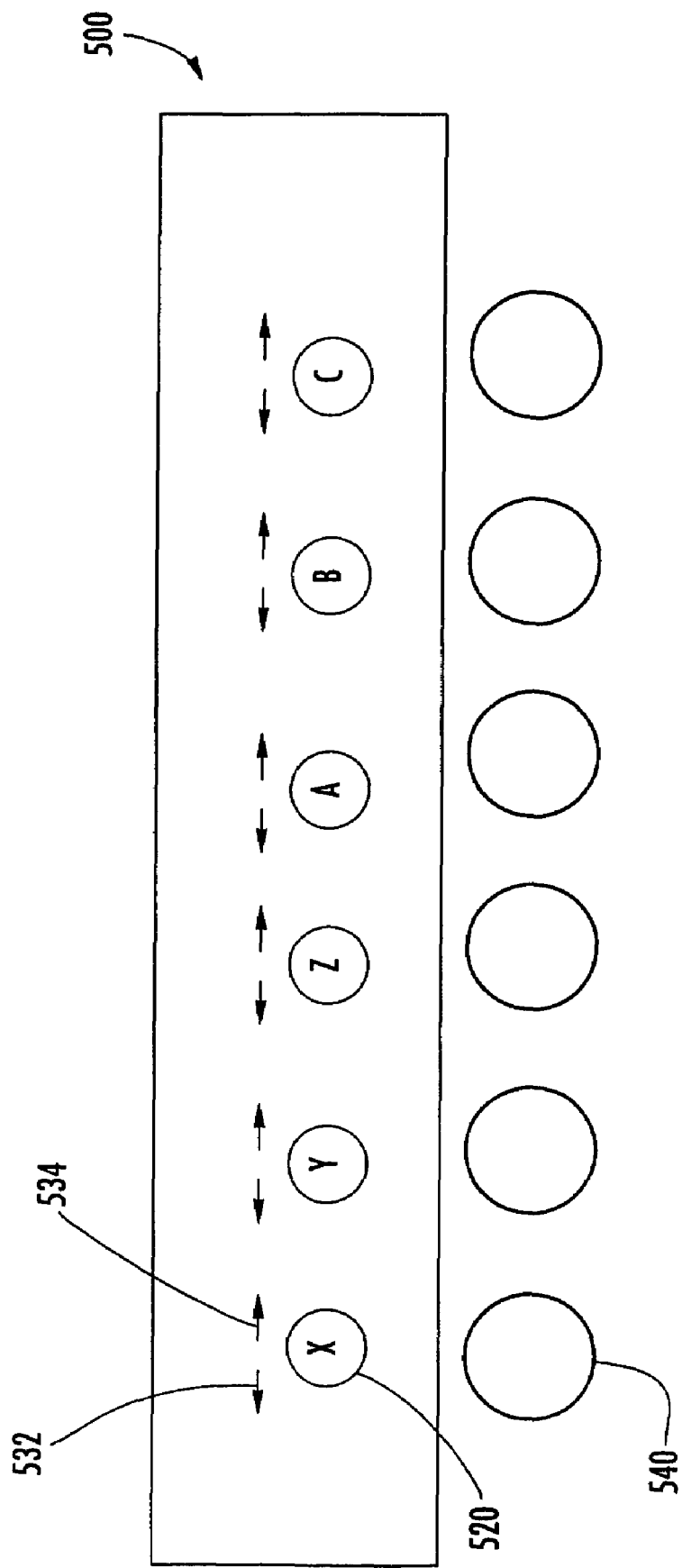
FIG. 8 is a schematic view of an operator interface and controls according to another illustrative embodiment of the invention.

According to another illustrative embodiment of the invention, an operator interface may optionally be provided. As illustrated in FIG. 8, an operator interface 500 according to an illustrative embodiment of the present invention includes indicators related to each of the six degrees of freedom of movement of the test head 160. For example, a degree of freedom designator 520 is provided to designate the x axis. Arrows 532, 534, are provided to indicate an instruction to an operator to activate the corresponding control 540 to correct the position of the test head 160 relative to that degree of freedom. For example, if the control 540 needed to be activated in a counter clock wise direction, the arrow 532 corresponding to that direction of operation of a control 540 could be activated. Examples of methods of activation of the arrows include illuminating the arrows with a solid light, using flashing illumination of the arrow, or illustrating the arrow only when activated. Each of the degree of freedom designators 520 may also flash or otherwise indicate that action is needed. With respect to FIG. 8 it is understood that each of the degrees of freedom x, y, z, a, b, and c have a corresponding control and pair of arrows. The degrees of freedom, a, b and c can correspond to twist, tumble and Theta, also known as pitch, roll and yaw. A wide variety of controls 540 are within the scope of the invention. Hand wheels and/or switches are examples of such controls.

In various implementations, the controls 540 may be disengaged upon correction of positional error corresponding to that control. Also, various implementations may use variable rate control responsiveness. Examples can include large positional changes in relation to each turn of a hand wheel when the positional error is large, with a reduction in positional change per wheel turn as the positional error is reduced. As noted above, the control may be disengaged upon elimination of the positional error, thereby providing a safety feature to minimize damage to the test head and/or peripheral caused by overcorrection of positional error.

In an alternative implementation, the operator interface may be in the form of a video image. According to this implementation of the invention, the video image can show the actual and desired positions of the test head. The video image may optionally show various perspectives and/or zoom levels, optionally including various graphical signals indicating error levels. Optionally, the graphical symbols may be located in the video image proximate to the sensor or item to which it corresponds. The video image may also include instruction(s) to the operator on how to correct the positioning error, e.g. turn red crank clockwise.

Operator inputs can be managed by either gearing down the lead screw drives or using electric motors. The manipulator could use non-back drivable lead screws. Optionally, axis locks could be eliminated, avoiding a need to engage or disengage them.

By driving the test head to the desired position, outer pull down modules may not be required to provide an outer dock. The elimination of a fixed position outer dock opens up a new way to do soft docking, multi-site docking, and compensate for variable DIB thickness. The elimination of an outer dock could provide benefits, such as cost and functionality. Without an outer dock, the test head could be driven or pre-programmed to any desired position relative to the peripheral. This capability would allow for multi-site soft docking.

Figure 9:
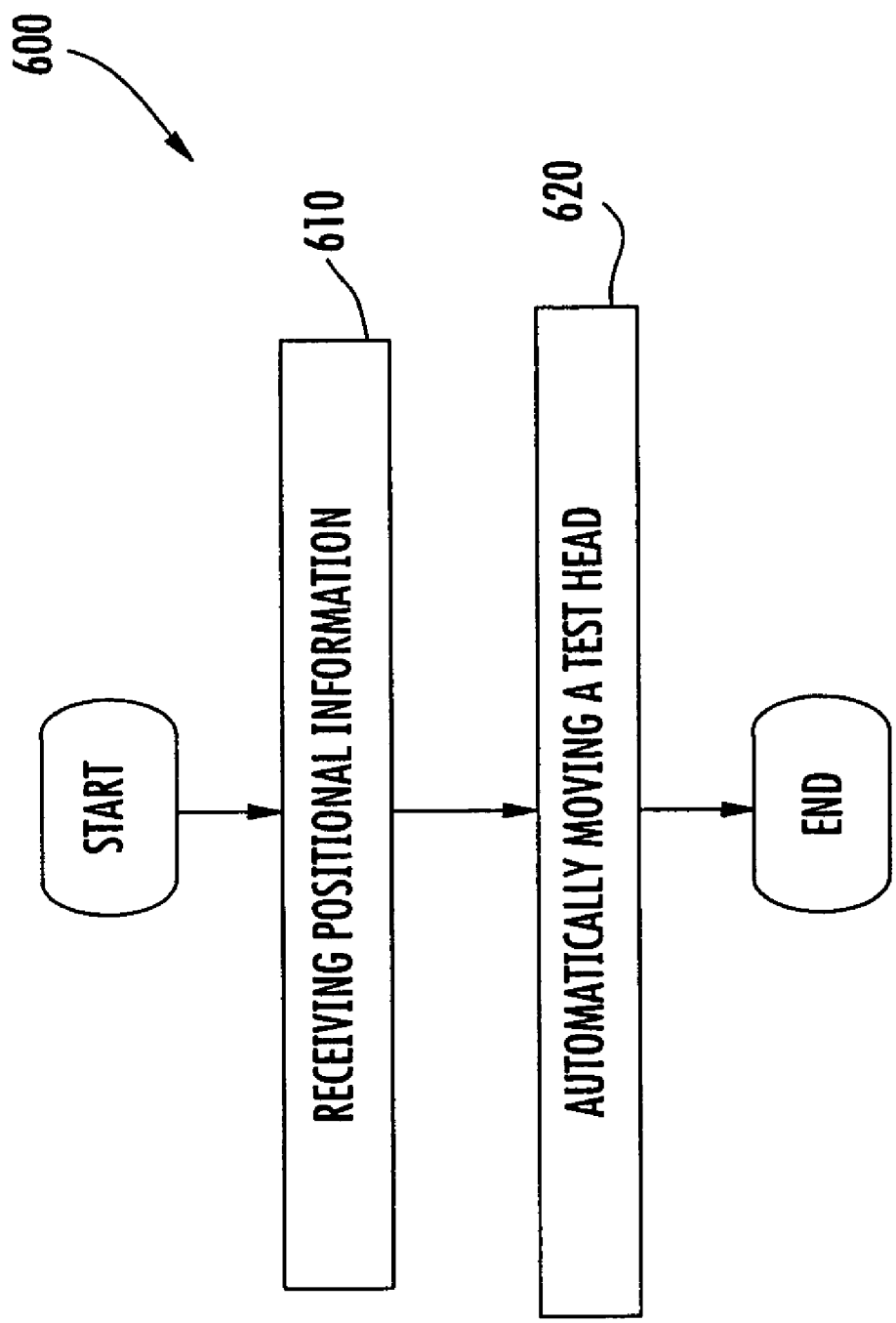
FIG. 9 is a flowchart of a method according to an illustrative embodiment of the invention.

As illustrated in FIG. 9, a method 600 is provided according to another illustrative embodiment of the invention. According to the method 600 for docking a test head, positional information is received 610 regarding a position of a peripheral relative to a test head. The test head is supported by a manipulator. The test head is automatically moved 620 relative to the peripheral, in position to enable docking of the test head to the peripheral by instructing a manipulator to move the test head relative to the peripheral.

The illustrative embodiments, implementations and examples herein are meant to be illustrative and not limiting. The present invention has been described by way of example, and modifications and variations of the exemplary embodiments will suggest themselves to skilled artisans in this field without departing from the spirit of the invention. Features and characteristics of the above-described embodiments may be used in combination. The preferred embodiments are merely illustrative and should not be considered restrictive in any way. The scope of the invention is to be measured by the appended claims, rather than the preceding description, and all variations and equivalents that fall within the range of the claims are intended to be embraced therein.

What is claimed is:

1. A method for docking a test head, comprising:
receiving positional information from a sensor regarding a position of a peripheral relative to a test head, at least one of the group of the test head and the peripheral supported by a manipulator; and
automatically moving the test head relative to the peripheral, in position to enable docking of the test head to the peripheral by instructing the manipulator to move at least one of the group of the test head and the peripheral relative to the other of the group;
wherein the sensor comprises an alignment receptacle adapted to interact with a pin to generate relative positional data along at least two transverse axes; and
wherein the step of receiving positional information from the sensor comprises receiving the relative positional data along at least two transverse axes generated by the sensor.

2. The method of claim 1, wherein the step of receiving comprises receiving relative x-axis and y-axis positional data from the sensor.

3. The method of claim 2, wherein the step of receiving comprises receiving relative z-axis positional data from the sensor.

4. The method of claim 1, wherein the step of receiving comprises receiving relative x-axis, y-axis and z-axis positional data from each of three coarse alignment receptacles.

5. The method of claim 1, wherein the step of receiving comprises receiving positional data from at least one of the group of a machine vision system and a digital image to determine at least one degree of freedom of the test head relative to the peripheral.

6. The method of claim 5, wherein the step of receiving comprises receiving z-axis positional data from a mechanical position detector of the test head relative to the peripheral.

7. The method of claim 1, further comprising activating at least one cam to cause a final pull down.

8. The method of claim 1, further comprising, after the automatically moving step, activating at least one outer pull down module to draw the test head closer to the peripheral.

9. The method of claim 1, further comprising, after the automatically moving step, activating at least one cam by the use of a cable to draw the test head closer to the peripheral.

10. The method of claim 1, wherein the automatically moving step includes instructions to the manipulator to move to change at least two of pitch, roll and yaw of the test head relative to the peripheral.

* * * * *